United States Patent
Lau et al.

(10) Patent No.: US 9,401,104 B2
(45) Date of Patent: Jul. 26, 2016

(54) POLISHING COMPOSITION FOR EDGE ROLL-OFF IMPROVEMENT

(71) Applicant: Cabot Microelectronics Corporation, Aurora, IL (US)

(72) Inventors: Hon Wu Lau, Aurora, IL (US); Michael White, Ridgefield, CT (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 14/269,622

(22) Filed: May 5, 2014

(65) Prior Publication Data

US 2015/0315417 A1    Nov. 5, 2015

(51) Int. Cl.
| | |
|---|---|
| *G09G 1/02* | (2006.01) |
| *B24B 37/04* | (2012.01) |
| *H01L 21/321* | (2006.01) |
| *C09G 1/04* | (2006.01) |

(52) U.S. Cl.
CPC .............. *G09G 1/02* (2013.01); *B24B 37/044* (2013.01); *C09G 1/04* (2013.01); *H01L 21/3212* (2013.01)

(58) Field of Classification Search
CPC .............. C09G 1/02; C09G 1/04; C09G 1/16; H01L 21/30625; H01L 21/3212; H01L 2224/13155
See application file for complete search history.

(56) References Cited

U.S. PATENT DOCUMENTS

| | | | |
|---|---|---|---|
| 5,196,353 A | 3/1993 | Sandhu et al. | |
| 5,230,833 A | 7/1993 | Romberger et al. | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,914,442 A | 6/1999 | Birkhofer et al. | |
| 5,949,927 A | 9/1999 | Tang | |
| 5,964,643 A | 10/1999 | Birang et al. | |
| 6,471,884 B1 * | 10/2002 | Fang et al. | 216/89 |
| 6,645,051 B2 | 11/2003 | Sugiyama et al. | |
| 6,755,721 B2 | 6/2004 | Ward et al. | |
| 6,945,851 B2 | 9/2005 | Ward et al. | |
| 7,524,347 B2 | 4/2009 | Sun et al. | |
| 8,226,841 B2 | 7/2012 | Palanisamy Chinnathambi et al. | |

(Continued)

FOREIGN PATENT DOCUMENTS

| | | |
|---|---|---|
| JP | 2013-138053 A | 7/2013 |
| WO | WO 2010/141652 A2 | 12/2010 |

OTHER PUBLICATIONS

Korean Intellectual Property Office, International Search Report in International Patent Application No. PCT/US2015/028544 (Jul. 28, 2015).

*Primary Examiner* — Duy Deo
(74) *Attorney, Agent, or Firm* — Thomas Omholt; Arlene Hornilla; Ashlee B. Szelag

(57) ABSTRACT

The invention provides a chemical-mechanical polishing composition including (a) an abrasive comprising wet-process silica particles, (b) a water-soluble polymer, (c) an oxidizing agent, (d) a chelating agent, (e) a pH-adjusting agent, and (f) an aqueous carrier, wherein the pH of the polishing composition is about 1 to about 7. The invention also provides a method of polishing a substrate, especially a nickel-phosphorus substrate, with the polishing composition.

33 Claims, 6 Drawing Sheets

(56) References Cited

U.S. PATENT DOCUMENTS

| | | |
|---|---|---|
| 8,404,009 B2 | 3/2013 | Suzuki et al. |
| 8,518,135 B1 | 8/2013 | Lorpitthaya et al. |
| 8,557,137 B2 | 10/2013 | Chinnathambi et al. |
| 2002/0102923 A1 | 8/2002 | Sugiyama et al. |
| 2003/0051413 A1 | 3/2003 | Sakai et al. |
| 2004/0157535 A1* | 8/2004 | Chaneyalew et al. ........... 451/41 |
| 2006/0096496 A1 | 5/2006 | Sun et al. |
| 2006/0124594 A1 | 6/2006 | Lim et al. |
| 2007/0264829 A1 | 11/2007 | Choi et al. |
| 2008/0096390 A1* | 4/2008 | Li .................. 438/693 |
| 2012/0094490 A1 | 4/2012 | Choi et al. |
| 2012/0270399 A1 | 10/2012 | Shin et al. |
| 2012/0273715 A1 | 11/2012 | Palanisamy Chinnathambi et al. |
| 2013/0146804 A1 | 6/2013 | Mizuno et al. |
| 2013/0313226 A1 | 11/2013 | Palanisamy Chinnathambi et al. |
| 2014/0349484 A1 | 11/2014 | Yokota et al. |

* cited by examiner

POLISHING COMPOSITION FOR EDGE ROLL-OFF IMPROVEMENT

BACKGROUND OF THE INVENTION

The demand for increased storage capacity in memory or rigid disks and the trend towards miniaturization of memory or rigid disks (e.g., due to the requirement for smaller hard drives in computer equipment) continues to emphasize the importance of the memory or rigid disk manufacturing process, including the planarization or polishing of such disks for ensuring maximal performance. While there exist several chemical-mechanical polishing (CMP) compositions and methods for use in conjunction with semiconductor device manufacture, few conventional CMP methods or commercially available CMP compositions are well-suited for the planarization or polishing of memory or rigid disks.

The term "memory or rigid disk" refers to any magnetic disk, hard disk, rigid disk, or memory disk for retaining information in electromagnetic form. The memory or rigid disk typically has a surface that comprises nickel-phosphorus, but the memory or rigid disk surface can comprise any other suitable material. The planarity of the memory or rigid disks must be improved, as the distance between the recording head of a disk drive and the surface of the memory or rigid disk has decreased with improvements in recording density that demand a lower flying height of the magnetic head with respect to the memory or rigid disk. In order to permit a lower flying height of the magnetic head, improvements to the surface finish of the memory or rigid disk are required.

Surface characteristics of memory or rigid disks affecting the flying height of the magnetic head include waviness, microwaviness, and surface roughness. Waviness or warp is a gross deviation from flatness over the entire disk surface. An intermediate form of surface deviation, herein referred to as microwaviness, may exist. Mircowaviness is a waviness of a disk surface for a range of wavelengths that are on the order of the length of the transducing head. Using current technology, these wavelengths are approximately in the range of 10 to 5000 microns. For low flying head heights, microwaviness can create an airbearing resonance, thereby causing excessive head to disk spacing modulation. The spacing modulation resulting from microwaviness can cause poor overwriting of data on the disk surface, and in some cases can even cause collision of the head with the disk surface with resulting damage to the disk surface and/or the recording head.

Surface roughness is a surface characteristic at yet smaller wavelengths. Surface roughness is a high frequency, short wavelength component of a measured surface which affects performance of memory or rigid disks insofar as it limits the decrease in the gap between the disk surface and the recording head of a disk drive that is practically achievable. Generally, polishing compositions for memory or rigid disks comprise abrasives to increase the removal rates of the substrate. High removal rates also are achieved by an increase in downward force of the polishing pad to the substrate. However, an increase in the downward force leads to abrasive particles becoming embedded into the substrate surface, which negatively impacts surface roughness.

During the polishing of a memory or rigid disk, typically the edges of the disk receive a higher pressure from the polishing tool than the remaining surface of the disk, which leads to the formation of a curved, or rounded, contour at the edges of the disk. The rounded edge areas are known in the art as edge roll-off, rub-off, or dub-off. Such rounded areas on a disk are unsuitable for recording.

A need remains for polishing compositions and methods for planarizing or polishing memory or rigid disks which minimize microwaviness and edge roll-off, without sacrificing the removal rate or surface roughness. The invention provides such polishing compositions and methods. These and other advantages of the invention, as well as additional inventive features, will be apparent from the description of the invention provided herein.

BRIEF SUMMARY OF THE INVENTION

The invention provides a chemical-mechanical polishing composition comprising (a) an abrasive comprising wet-process silica particles, (b) a water-soluble polymer, (c) an oxidizing agent, (d) a chelating agent, (e) a pH-adjusting agent, and (f) an aqueous carrier, wherein the pH of the polishing composition is about 1 to about 7.

The invention also provides a method of polishing a substrate comprising (i) providing a substrate, such as a nickel phosphorus layer; (ii) providing a polishing pad; (iii) providing a chemical-mechanical polishing composition comprising (a) an abrasive comprising wet-process silica particles, (b) a water-soluble polymer, (c) an oxidizing agent, (d) a chelating agent, (e) a pH-adjusting agent, and (f) an aqueous carrier, wherein the pH of the polishing composition is about 1 to about 7; (iv) contacting the substrate with the polishing pad and the chemical-mechanical polishing composition; and (v) moving the polishing pad and the chemical-mechanical polishing composition relative to the substrate, such as the nickel phosphorus layer on a surface of the substrate, to abrade at least a portion of the substrate to polish the substrate.

DETAILED DESCRIPTION OF THE INVENTION

Figure 1:
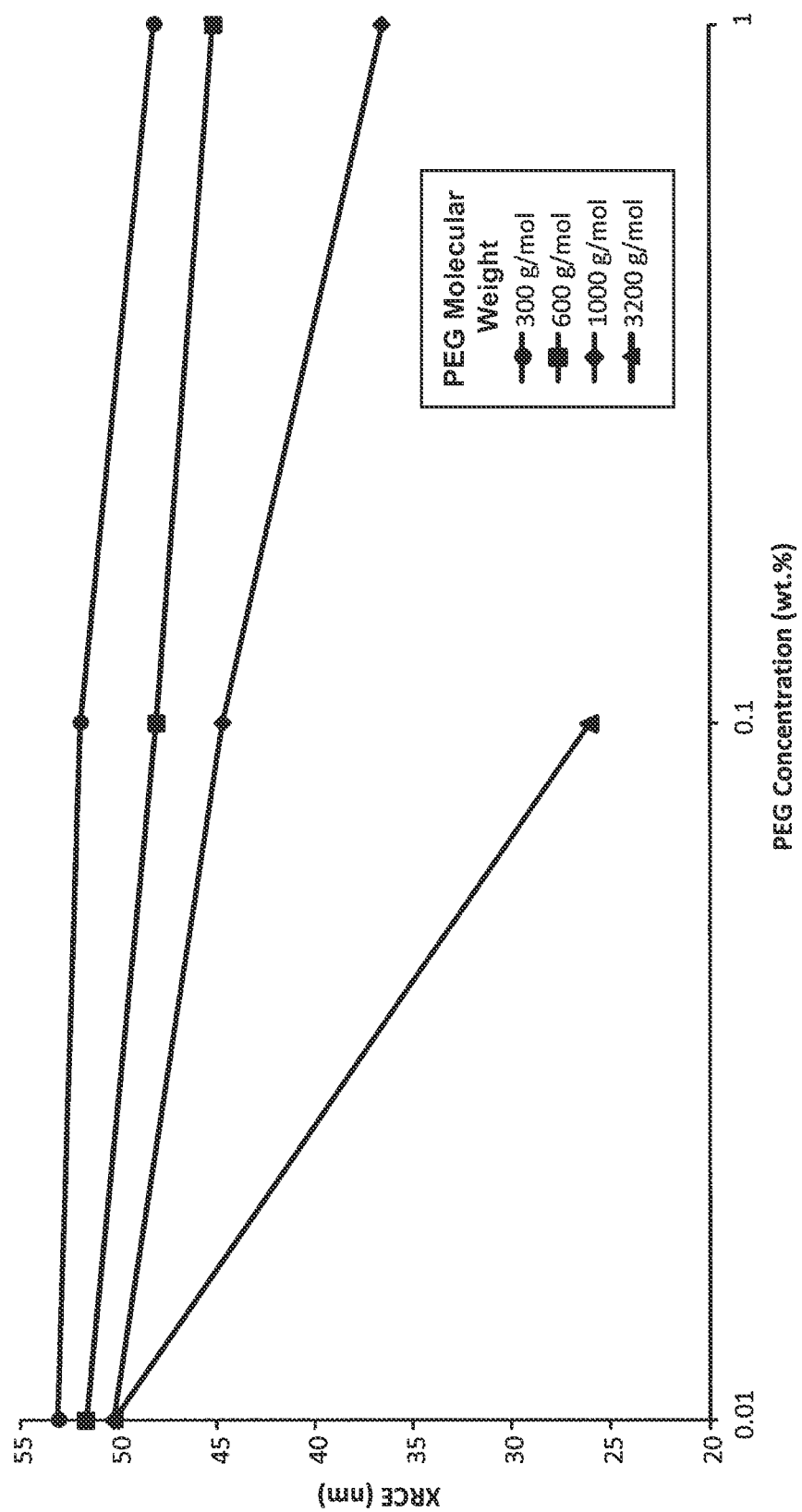
FIG. 1 is a graph of edge roll-off (XRCE) (nm) versus PEG concentration (wt. %) (in logarithmic scale) for polishing compositions comprising polyethylene glycol homopolymers of varying molecular weights.

The invention provides a chemical-mechanical polishing composition comprising, consisting essentially of, or consisting of (a) an abrasive comprising wet-process silica particles, (b) a water-soluble polymer, (c) an oxidizing agent, (d) a chelating agent, (e) a pH-adjusting agent, and (f) an aqueous carrier, wherein the pH of the polishing composition is about 1 to about 7.

The polishing composition comprises an abrasive (i.e., one or more abrasives). The abrasive can be any suitable abrasive or combination of abrasives. Preferably, the abrasive comprises, consists essentially of, or consists of wet-process silica particles. Wet-process silica particles include, for example, precipitated silica particles or condensation-polymerized silica particles, such as colloidal silica particles, and do not include pyrogenic or fumed silica (which is in the form of chain-like aggregates). Preferably, the wet-process silica particles are condensation-polymerized silica particles. Condensation-polymerized silica particles typically are prepared by condensing $Si(OH)_4$ to form colloidal particles, where colloidal is defined as having an average particle size between about 1 nm and about 1000 nm. Such abrasive particles can be prepared in accordance with U.S. Pat. No. 5,230,833, or can be obtained as any of various commercially available products, such as the Akzo-Nobel BINDZIL™ silica products and the Nalco silica products, as well as other similar products available from DuPont, Bayer. Applied Research, Nissan Chemical, Fuso, and Clariant.

The wet-process silica particles can have any suitable particle size. The particle size of a particle is the diameter of the smallest sphere that encompasses the particle. The particle size of the wet-process silica particles can be measured using any suitable technique, for example, using laser diffraction techniques. Suitable particle size measurement instruments are commercially available, such as from Malvern Instruments (Malvern, UK). The wet-process silica particles can have an average particle size of about 1 nm or more, e.g., about 2 nm or more, about 3 nm or more, about 4 nm or more, about 5 nm or more, about 10 nm or more, about 15 nm or more, about 20 nm or more, about 25 nm or more, about 30 nm or more, about 35 nm or more, about 40 nm or more, about 45 nm or more, about 50 nm or more, about 55 nm or more, about 60 nm or more, about 65 am or more, or about 70 nm or more. Alternatively, or in addition, the wet-process silica particles can have an average particle size of about 1000 nm or less, e.g., about 900 nm or less, about 800 nm or less, about 750 nm or less, about 500 nm or less, about 300 nm or less, about 250 nm or less, about 200 nm or less, about 150 nm or less, about 120 nm or less, about 100 nm or less, about 75 nm or less, or about 70 nm or less. Thus, the wet-process silica particles can have an average particle size within a range bounded by any two of the aforementioned endpoints.

For example, the wet-process silica particles can have an average particle size of about 1 nm to about 1000 nm, e.g., about 4 nm to about 750 nm, about 4 nm to about 500 nm, about 4 am to about 300 nm, about 4 nm to about 120 am, about 4 nm to about 100 am, about 10 nm to about 750 nm, about 10 nm to about 500 am, about 10 nm to about 300 nm, about 10 nm to about 120 nm, about 10 nm to about 100 am, about 20 nm to about 750 nm, about 20 nm to about 500 nm, about 20 nm to about 300 nm, about 20 nm to about 120 nm, about 20 nm to about 100 nm, about 50 nm to about 750 am, about 50 nm to about 500 nm, about 50 nm to about 300 nm, about 50 nm to about 120 nm, or about 50 nm to about 100 nm.

Preferably, the wet-process silica particles have an average particle size of about 4 nm to about 300 nm, e.g., an average particle size of about 4 nm, an average particle size of about 5 nm, an average particle size of about 6 nm, an average particle size of about 7 nm, an average particle size of about 8 nm, an average particle size of about 9 nm, an average particle size of about 10 nm, an average particle size of about 15 nm, an average particle size of about 45 nm, an average particle size of about 55 nm, an average particle size of about 80 am, an average particle size of about 150 nm, an average particle size of about 200 nm, an average particle size of about 250 nm, or an average particle size of about 300 nm. More preferably, the wet-process silica particles have an average particle size of about 20 nm to about 100 nm, e.g., an average particle size of about 20 am, an average particle size of about 25 nm, an average particle size of about 30 nm, an average particle size of about 35 nm, an average particle size of about 40 am, an average particles size of about 50 nm, an average particle size of about 60, an average particle size of about 75 nm, or an average particle size of about 100 nm.

The wet-process silica particles can be present in the polishing composition at any suitable concentration. For example, the wet-process silica particles can be present in the polishing composition at a concentration of about 1 wt. % or more, e.g., about 1.25 wt. % or more, about 1.5 wt. % or more, about 1.75 wt. % or more, about 2 wt. % or more, about 2.25 wt. % or more, about 2.5 wt. % or more, about 3 wt. % or more, about 3.5 wt. % or more, about 4 wt. % or more, about 4.5 wt. % or more, or about 5 wt. % or more. Alternatively, or in addition, the wet-process silica particles can be present in the polishing composition at a concentration of about 10 wt. % or less, e.g., about 9 wt. % or less, about 8 wt. % or less, about 7.5 wt. % or less, 7 wt. % or less, about 6.5 wt. % or less, about 6 wt. % or less, about 5.5 wt. % or less, or about 5 wt. % or less. Thus, the wet-process silica particles can be present in the polishing composition at a concentration within a range bounded by any two of the aforementioned endpoints.

For example, the wet-process silica particles can be present in the polishing composition at a concentration of about 1 wt. % to about 10 wt. %, e.g., about 1 wt. % to about 7.5 wt. %, about 1 wt. % to about 5 wt. %, about 1 wt. % to about 3 wt. %, about 2 wt. % to about 5 wt. %, about 3 wt. % to about 5 wt. %, or about 4 wt. % to about 5 wt. %. Preferably, the wet-process silica particles are present in the polishing composition at a concentration of about 2 wt. % to about 5 wt. %, e.g., about 2 wt. %, about 2.25 wt. %, about 2.5 wt. %, about 3 wt. %, about 3.5 wt. %, about 4 wt. %, about 4.5 wt. %, or about 5 wt. %.

The abrasive optionally can further comprise alpha alumina particles. Alpha alumina refers to a crystalline polymorph of aluminum oxide formed at high temperatures above 1400° C. Alpha alumina typically refers to alumina comprising about 50 wt. % or more of the alpha polymorph. As used herein, the amount of alpha alumina in the polishing composition refers to the total weight of crystalline alumina present therein, wherein about 50 wt. % or more of the crystalline alumina comprises the alpha polymorph. Alpha alumina is well known in the art and available commercially in a wide range of particle sizes and surface areas.

The alpha alumina particles can have any suitable particle size. The particle size of a particle is the diameter of the smallest sphere that encompasses the particle. The particle size of the alpha alumina particles can be measured using any suitable technique, for example, using laser diffraction techniques. Suitable particle size measurement instruments are commercially available, such as from Malvern Instruments (Malvern, UK). The alpha alumina particles can have an average particle size of about 50 nm or more, e.g., about 55 nm or more, about 60 nm or more, about 75 nm or more, about 100 nm or more, about 125 nm or more, about 150 nm or more, about 175 nm or more, about 200 nm or more, about 225 nm or more, about 250 nm or more, about 280 nm or more, about 300 nm or more, or about 350 nm or more. Alternatively, or in addition, the alpha alumina particles can have an average particle size of about 1000 nm or less, e.g., about 900 nm or less, about 800 nm or less, about 750 nm or less, about 600 nm or less, about 500 nm or less, about 400 nm or less, or about 350 nm or less. Thus, the alpha alumina particles can have an average particle size within a range bounded by any two of the aforementioned endpoints.

For example, the alpha alumina particles can have an average particle size of about 50 nm to about 1000 nm, e.g., about 50 nm to about 750 nm, about 50 nm to about 500 nm, about 50 nm to about 450 nm, about 50 nm to about 400 nm, about 50 nm to about 350 nm, about 100 nm to about 400 nm, about 100 nm to about 350 nm, about 200 nm to about 400 nm, about 200 nm to about 350 nm, about 200 nm to about 300 nm, about 250 nm to about 400 nm, about 250 nm to about 350 nm, about 250 nm to about 300 nm, about 300 nm to about 500 nm, about 300 nm to about 400 nm, about 350 nm to about 500 nm, or about 350 nm to about 400 nm.

Preferably, the alpha alumina particles have an average particle size of about 100 nm to about 500 nm, e.g., an average particle size of about 100 nm, an average particle size of about 150 nm, an average particle size of about 200 nm, an average particle size of about 250 nm, an average particle size of about 280 nm, an average particle size of about 300 nm, an average particle size of about 325 nm, an average particle size of about 350 nm, an average particle size of about 400 nm, or an average particle size of about 500 nm. More preferably, the alpha alumina particles have an average particle size of about 200 nm to about 400 nm. Even more preferably, the alpha alumina particles have an average particle size of about 250 nm to about 400 nm. Most preferably, the alpha alumina particles have an average particle size of about 280 nm to about 350 nm.

The alpha alumina particles can be present in the polishing composition at any suitable concentration. For example, the alpha alumina particles can be present in the polishing composition at a concentration of about 0.3 wt. % or more, e.g., about 0.35 wt. % or more, about 0.4 wt. % or more, about 0.45 wt. % or more, about 0.5 wt. % or more, about 0.6 wt. % or more, about 0.7 wt. % or more, about 0.8 wt. % or more, about 0.9 wt. % or more, or about 1 wt. % or more. Alternatively, or in addition, the alpha alumina particles can be present in the polishing composition at a concentration of about 2 wt. % or less, e.g., about 1.75 wt. % or less, about 1.5 wt. % or less, about 1.25 wt. % or less, or about 1 wt. % or less. Thus, the alpha alumina particles can be present in the polishing composition at a concentration within a range bounded by any two of the aforementioned endpoints.

For example, the alpha alumina particles can be present in the polishing composition at a concentration of about 0.3 wt. % to about 2 wt. %. e.g., about 0.4 wt. % to about 1.5 wt. %, about 0.5 wt. % to about 1 wt. %, about 0.5 wt. % to about 0.9 wt. %, or about 0.5 wt. % to about 0.75 wt. %. Preferably, the alpha alumina particles are present in the polishing composition at a concentration of about 0.5 wt. % to about 1 wt. %, e.g., about 0.5 wt. %, about 0.6 wt. %, about 0.65 wt. %, about 0.7 wt. %, about 0.75 wt. %, about 0.8 wt. %, about 0.85 wt. %, about 0.9 wt. %, or about 1 wt. %.

The abrasive optionally can further comprise fumed alumina particles. Fumed alumina is an amorphous form of aluminum oxide. Fumed alumina can be prepared from any suitable volatile or nonvolatile precursor. Fumed alumina can be produced from volatile precursors by hydrolysis and/or oxidation of the precursors (e.g., metal chloride) in a high temperature flame ($H_2$/air or $H_2$/$CH_4$/air). Fumed alumina can be prepared from nonvolatile precursors by dissolving or dispersing the precursor in a suitable solvent such as water, alcohol, or acid-based solvent. The solution containing the precursor can be sprayed into a high temperature flame using a droplet generator, and the metal oxide aggregate then can be collected. Typical droplet generators include bi-fluid atomizers, high pressure spray nozzles, and ultrasonic atomizers. Fumed alumina is well known in the art and available commercially in a wide range of particle sizes and surface areas.

The fumed alumina particles can have any suitable particle size. The particle size of a particle is the diameter of the smallest sphere that encompasses the particle. The particle size of the fumed alumina particles can be measured using any suitable technique, for example, using laser diffraction techniques. Suitable particle size measurement instruments are commercially available, such as from Malvern Instruments (Malvern, UK). The fumed alumina particles can have an average particle size of about 30 nm or more, e.g., about 40 nm or more, about 50 nm or more, about 60 nm or more, about 70 nm or more, about 80 am or more, about 90 nm or more, or about 100 nm or more. Alternatively, or in addition, the fumed alumina particles can have an average particle size of about 250 nm or less, e.g., about 230 nm or less, about 210 nm or less, about 190 am or less, about 170 nm or less, or about 150 nm or less. Thus, the fumed alumina particles can have an average particle size within a range bounded by any two of the aforementioned endpoints. For example, the fumed alumina particles can have an average particle size of about 30 nm to about 250 nm, e.g., about 80 nm to about 250 nm, about 80 nm to about 210 nm, or about 100 nm to about 150 nm.

The fumed alumina panicles can be present in the polishing composition at any suitable concentration. For example, the fumed alumina particles can be present in the polishing composition at a concentration of about 0.005 wt. % or more, e.g., about 0.0075 wt. % or more, about 0.01 wt. % or more, about 0.025 wt. % or more, about 0.05 wt. % or more, about 0.075 wt. % or more, about 0.1 wt. % or more, about 0.25 wt. % or more, about 0.35 wt. % or more, or about 0.5 wt. % or more. Alternatively, or in addition, the fumed alumina particles can be present in the polishing composition at a concentration of about 1 wt. % or less, e.g., about 0.75 wt. % or less, about 0.6 wt. % or less, about 0.5 wt. % or less, about 0.3 wt. % or less, about 0.2 wt. % or less, or about 0.1 wt. % or less. Thus, the fumed alumina particles can be present in the polishing composition at a concentration within a range bounded by any two of the aforementioned endpoints.

For example, the fumed alumina particles can be present in the polishing composition at a concentration of about 0.005 wt. % to about 1 wt. %, e.g., about 0.005 wt. % to about 0.75 wt. %, about 0.01 wt. % to about 0.5 wt. %, about 0.025 wt. % to about 0.5 wt. %, about 0.05 wt. % to about 0.5 wt. %, or about 0.05 wt. % to about 0.25 wt. %. Preferably, the fumed alumina particles are present in the polishing composition at a concentration of about 0.05 wt. % to about 0.25 wt. %. e.g., about 0.05 wt. %, about 0.06 wt. %, about 0.075 wt. %, about 0.1 wt. %, about 0.15 wt. %, about 0.2 wt. %, or about 0.25 wt. %.

Thus, the abrasive can comprise, consist essentially of, or consist of wet-process silica particles and alpha alumina particles. Alternatively, the abrasive can comprise, consist essentially of, or consist of wet-process silica particles and fumed alumina particles. In addition, the abrasive can comprise, consist essentially of, or consist of wet-process silica particles, alpha alumina particles, and fumed alumina particles.

The polishing composition optionally may comprise an additional abrasive. The additional abrasive can be, for example, metal oxide abrasive particles of ceria (e.g., cerium oxide), zirconia (e.g., zirconium oxide), silica (e.g., silicon dioxide), alumina (e.g., aluminum oxide), titania (e.g., titanium dioxide), germania (e.g., germanium dioxide, germanium oxide), magnesia (e.g., magnesium oxide), nickel oxide, co-formed products thereof, or combinations thereof. Alternatively, the additional abrasive can be organic particles of gelatin, latex, cellulose, polystyrene, or polyacrylate.

Desirably, the polishing composition comprises an abrasive (e.g., wet-process silica particles, optionally in further combination with alpha alumina particles, fumed alumina particles, and/or additional abrasive particles) at a (total) concentration of about 0.005 wt. % to about 10 wt. %, e.g., about 0.01 wt. % to about 10 wt. %, about 0.05 wt. % to about 10 wt. %, about 0.1 wt. % to about 10 wt. %, about 0.5 wt. % to about 10 wt. %, about 1 wt. % to about 10 wt. %, about 2 wt. % to about 10 wt. %, about 2 wt. % to about 5 wt. %, or about 5 wt. % to about 10 wt. %.

The wet-process silica particles, alpha alumina particles, fumed alumina particles, and any additional abrasive particles present in the polishing composition desirably are suspended in the polishing composition, more specifically in the aqueous carrier of the polishing composition. When the abrasive particles are suspended in the polishing composition, the abrasive particles preferably are colloidally stable. The term colloid refers to the suspension of abrasive particles in the aqueous carrier. Colloidal stability refers to the maintenance of that suspension over time. In the context of this invention, abrasive particles are considered colloidally stable if, when the abrasive particles are placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of panicles in the abrasive composition ([C] in terms of g/ml) is less than or equal to 0.5 (i.e., {[B]−[T]}/[C] ≤0.5). The value of [B]−[T]/[C] desirably is less than or equal to 0.3, and preferably is less than or equal to 0.1.

The polishing composition comprises a water-soluble polymer (i.e., one or more water-soluble polymers). The water-soluble polymer can be any suitable water-soluble polymer or combination of water-soluble polymers, preferably a nonionic polymer. As used herein, the term "water-soluble" refers to a polymer that has a solubility of about 0.1 mg/ml or more (e.g., about 1 mg/ml or more) in water at 25° C. Preferably, the water-soluble polymer is freely soluble in water at 25° C. Desirably, the water-soluble polymer is liquid or waxy at room temperature.

Examples of water-soluble polymers suitable for use in the invention include polyethylene glycol (PEG) homopolymers, and polyethylene glycol (PEG) and polypropylene glycol (PPG) block copolymers (referred to herein as PEG block copolymers). Suitable PEG block copolymers include, for example, PEG-PPG-PEG block copolymers and PPG-PEG-PPG block copolymers, including, for example, polyether polyol copolymers, fatty alcohol alkoxylates, and end-capped fatty alcohol alkoxylates. Preferably, the water-soluble polymer is a polyethylene glycol homopolymer.

The polyethylene glycol homopolymer can have any suitable molecular weight (MW). Desirably, the polyethylene glycol homopolymer has a molecular weight of about 300 g/mol to about 50,000 g/mol, e.g., about 300 g/mol to about 30,000 g/mol, about 300 g/mol to about 25,000 g/mol, about 300 g/mol to about 15,000 g/mol, about 500 g/mol to about 10,000 g/mol, about 500 g/mol to about 7,000 g/mol, about 500 g/mol to about 5,000 g/mol, or about 500 g/mol to about 3500 g/mol. Preferably, the polyethylene glycol homopolymer has a molecular weight of about 300 g/mol to about 3500 g/mol, e.g., about 500 g/mol to about 3000 g/mol, about 500 g/mol to about 2500 g/mol, about 500 g/mol to about 2000 g % mol, about 500 g/mol to about 1000 g/mol, about 1000 g/mol to about 3500 g/mol, about 1000 g/mol to about 3000 g/mol, or about 1000 g/mol to about 2000 g/mol. More preferably, the polyethylene glycol homopolymer has a molecular weight of about 1000 g/mol or about 2000 g/mol. Suitable polyethylene glycol homopolymers are commercially available, for example, from Kanto Chemicals. Dow Chemical Company (e.g., CARBOWAX™ products), Mercury Chemical Company, or Prior Chemical Company.

The PEG block copolymer (e.g., PEG-PPG-PEG or PPG-PEG-PPG) can have any suitable molecular weight. Desirably, the PEG block copolymer has a molecular weight of about 500 g/mol to about 15,000 g/mol, e.g., about 500 g/mol to about 10,000 g/mol, about 500 g/mol to about 5000 g/mol, about 500 g/mol to about 3500 g/mol, about 1100 g/mol to about 14,600 g/mol, about 1900 g/mol to about 8400 g/mol, about 2000 g/mol to about 4400 g/mol, about 2000 g/mol to about 3300 g/mol, about 2000 g/mol to about 2700 g/mol, about 2700 g/mol to about 3000 g % mol, or about 2800 g/mol to about 290) g/mol. Preferably, the PEG block copolymer has a molecular weight of about 2000) g/mol to about 4500 g/mol, e.g., about 2000 g/mol to about 4000 g/mol, or about 2000 g/mol to about 3300 g/mol. For example, the PEG block copolymer can have a molecular weight of about 2000 g/mol, about 2200 g/mol, about 2500 g/mol, about 2700 g/mol, about 2800 g/mol, about 2900 g/mol, about 3000 g/mol, about 3300 g/mol, about 3500 g/mol, about 4000 g/mol, or about 4400 g/mol. Suitable PEG-PPG-PEG block copolymers are commercially available, such as from Sigma-Aldrich and BASF Corporation (e.g., PLURONIC™ L series products). Suitable PPG-PEG-PPG block copolymers are commercially available, such as from Sigma-Aldrich and BASF Corporation (e.g., PLURONIC™ 17R4). Suitable polyether polyols are commercially available, such as from Dow Chemical Company (e.g., TERGITOL™ L series products). Suitable fatty alcohol alkoxylates and end-capped fatty alcohol alkoxylates are commercially available, such as from BASF Corporation (e.g., PLURAFAC™ LF series products).

The water-soluble polymer can have any suitable hydrophilic-lipophilic balance (HLB). The HLB indicates the solubility of the water-soluble polymer in water and, thus, is related to the amount of the hydrophilic portion of the water-soluble polymer (e.g., the wt. % amount of ethylene oxide). HLB can be approximated, in some cases, for water-soluble polymers containing an ethylene oxide group as being equal to the wt. % amount of the ethylene oxide groups divided by 5. When a combination of water-soluble polymers is used in the polishing composition, the HLB can be estimated, in some cases, as the weight average of the water-soluble polymers. For example, for a mixture of two water-soluble polymers, the HLB is approximately equal to the sum of (quantity water-soluble polymer 1)(HLB water-soluble polymer 1) and (quantity water-soluble polymer 2)(HLB water-soluble polymer 2) divided by the sum of the quantity of water-soluble polymers 1 and 2. A low HLB indicates a lipophilic water-soluble polymer (i.e., having a small number of hydrophilic groups), and a high HLB indicates a hydrophilic water-soluble polymer (having a high number of hydrophilic groups). Water-soluble polymers having an HLB of 10 or greater can be classified to as being "hydrophilic," whereas water-soluble polymers having an HLB of less than 10 can be classified as being "lipophilic" (see e.g., The HLB System, published by ICI United States, Inc., 1976).

The water-soluble polymer, or mixture of water-soluble polymers, typically has an HLB of about 1 or more (e.g., about 2 or more, about 3 or more, about 4 or more, or about 7 or more). The HLB typically is about 30 or less (e.g., about 28 or less, about 25 or less, about 22 or less, about 20 or less, about 18 or less, about 12 or less). Thus, the water-soluble polymer can have an HLB within a range bounded by any two of the aforementioned endpoints. Preferably, the water-soluble polymer has an HLB of about 4 or more, e.g., about 7 or more, about 9 or more, about 10 or more, about 12 or more, about 15 or more, or about 20 or more. More preferably, the water-soluble polymer has an HLB of about 10 or more.

The water-soluble polymer can be present in the polishing composition at any suitable concentration. For example, the water-soluble polymer can be present in the polishing composition at a concentration of about 0.0001 wt. % or more. e.g., about 0.0005 wt. % or more, about 0.00075 wt. % or more, about 0.001 wt. % or more, about 0.005 wt. % or more, about 0.0075 wt. % or more, about 0.01 wt. % or more, about 0.05 wt. % or more, about 0.075 wt. % or more, or about 0.1 wt. % or more. Alternatively, or in addition, the water-soluble polymer can be present in the polishing composition at a concentration of about 1 wt. % or less, e.g., about 0.75 wt. % or less, about 0.5 wt. % or less, about 0.4 wt. % or less, about 0.25 wt. % or less, about 0.2 wt. % or less, about 0.15 wt. % or less, or about 0.1 wt. % or less. Thus, the water-soluble polymer can be present in the polishing composition at a concentration within a range bounded by any two of the aforementioned endpoints.

For example, the water-soluble polymer can be present in the polishing composition at a concentration of about 0.0001 wt. % to about 1 wt. %, e.g., about 0.0005 wt. % to about 1 wt. %, about 0.001 wt. % to about 1 wt. %, about 0.005 wt. % to about 1 wt. %, about 0.01 wt. % to about 1 wt. %, about 0.05 wt. % to about 1 wt. %, about 0.1 wt. % to about 1 wt. %, about 0.1 wt. % to about 0.5 wt. %, about 0.1 wt. % to about 0.3 wt. %, or about 0.1 wt. % to about 0.2 wt. %. Preferably, the water-soluble polymer is present in the polishing composition at a concentration of about 0.01 wt. % to about 0.5 wt. %. e.g., about 0.05 wt. % to about 0.5 wt. %, about 0.1 wt. % to about 0.5 wt. %, about 0.2 wt. % to about 0.5 wt. %, or about 0.3 wt. % to about 0.5 wt. %. More preferably, the water-soluble polymer is present in the polishing composition at a concentration of about 0.1 wt. % to about 0.2 wt. %, e.g., about 0.1 wt. %, about 0.15 wt. %, or about 0.2 wt. %.

The polishing composition further comprises an oxidizing agent (i.e., one or more oxidizing agents). The function of the oxidizing agent is to oxidize at least a part of a substrate, such as a layer or layers comprising, for example, nickel-phosphorus. The oxidizing agent can be any suitable oxidizing agent, or combination of oxidizing agents. Non-limiting examples of suitable oxidizing agents include hydrogen peroxide, persulfate salts (e.g., ammonium persulfate), ferric salts (e.g., ferric nitrate), solid forms of hydrogen peroxide, and combinations thereof. Solid forms of hydrogen peroxide include sodium percarbonate, calcium peroxide, and magnesium peroxide, which liberate free hydrogen peroxide when dissolved in water. Preferably, the oxidizing agent is hydrogen peroxide.

The oxidizing agent can be present in the polishing composition at any suitable concentration. For example, the oxidizing agent can be present in the polishing composition at a concentration of about 0.1 wt. % to about 5 wt. %, e.g., about 0.2 wt. % to about 5 wt. %, about 0.3 wt. % to about 5 wt. %, or about 0.3 wt. % to about 3 wt. %. Preferably, the oxidizing agent is present in the polishing composition at a concentration of about 0.3 wt. % to about 2 wt. %, e.g., about 0.3 wt. % to about 1.8 wt. %. More preferably, the oxidizing agent is present in the polishing composition at a concentration of about 0.6 wt. % to about 1.2 wt. %.

The polishing composition further comprises a chelating agent (i.e., one or more chelating agents). The chelating agent can be any suitable chelating agent, or combination of chelating agents, for a material of the substrate being polished with the polishing composition, typically nickel. Non-limiting examples of suitable chelating agents include amino acids (for example, glycine) and organic carboxylic acids (for example nicotinic acid, malonic acid, or tartaric acid).

The chelating agent can be present in the polishing composition at any suitable concentration. For example, the chelating agent can be present in the polishing composition at a concentration of about 0.005 wt. % or more, about 0.0075 wt. % or more, about 0.01 wt. % or more, about 0.05 wt. % or more, about 0.075 wt. % or more, about 0.1 wt. % or more, or about 0.25 wt. % or more. Alternatively, or in addition, the chelating agent can be present in the polishing composition at a concentration of about 10 wt. % or less, e.g., about 8 wt. % or less, about 5 wt. % or less, about 3 wt. % or less, about 2 wt. % or less, about 1.5 wt. % or less, or 1 wt. % or less. Thus, the chelating agent can be present in the polishing composition at a concentration within a range bounded by any two of the aforementioned endpoints. For example, the chelating agent can be present in the polishing composition at a concentration of about 0.005 wt. % to about 1 wt. %, e.g., about 0.01 wt. % to about 1 wt. %, about 0.05 wt. % to about 1 wt. %, about 0.1 wt. % to about 1 wt. %, about 0.25 wt. % to about 1 wt. %. Preferably, the chelating agent is present in the polishing composition at a concentration of about 0.5 wt. % to about 1 wt. %, e.g., about 0.5 wt. % to about 0.75 wt. %, about 0.75 wt. % to about 1 wt. %.

The polishing composition can have any suitable pH. Typically, the polishing composition has a pH of about 1 or greater. Also, the pH of the polishing composition typically is about 7 or less. For example, the pH can be in the range of about 1 to about 7, e.g., a pH of about 1, a pH of about 1.5, a pH of about 2, a pH of about 2.5, a pH of about 3, a pH of about 4, a pH of about 5, a pH of about 5.5, a pH of about 6, a pH of about 7, or a pH in a range defined by any two of these pH values. Preferably, the pH is in the range of about 1.5 to about 3. e.g., about 1.5 to about 2.5, about 1.5 to about 2, about 2 to about 2.5, about 2 to about 3, about 2.5 to about 3.

The pH of the polishing composition can be achieved and/or maintained by any suitable means. More specifically, the polishing composition can further comprise a pH adjustor, a pH buffering agent, or a combination thereof. Desirably, the polishing composition comprises a pH-adjusting agent. The pH-adjusting agent can be any suitable pH-adjusting agent. For example, the pH-adjusting agent can be sodium hydroxide, potassium hydroxide, ammonium hydroxide, sodium carbonate, potassium carbonate, sulfuric acid, hydrochloric acid, nitric acid, phosphoric acid, citric acid, potassium phosphate, mixtures thereof, and the like. Preferably, the pH-adjusting agent is nitric acid.

The polishing composition includes an aqueous carrier. The aqueous carrier contains water (e.g., deionized water) and optionally contains one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N. N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

The polishing composition optionally further comprises one or more other additives. Such additives include surfactants and/or rheological control agents, antifoaming agents, and biocides. Additives can be present in the polishing composition at any suitable concentrations. Such additives can include any suitable dispersing agent, such as, for example, homopolymers or random, block, or gradient acrylate copolymers comprising one or more acrylic monomers (e.g., polyacrylates, polymethacrylates, vinyl acrylates, and styrene acrylates), combinations thereof, and salts thereof. The biocide can be any suitable biocide, for example, an isothiazolinone biocide.

The polishing composition can have any suitable viscosity. The viscosity of the polishing composition can be measured by any suitable method known to one of ordinary skill in the art, including, for example, using a Brookfield viscometer. Typically, the polishing composition has a viscosity of about 2 centipoise (cps) or more, e.g., about 2.2 or more, or about 2.5 or more, when measured as a 2% solution in water at 25° C. Alternatively, or in addition, the polishing composition can have a viscosity of about 5 cps or less. e.g., about 4.7 or less, or about 4.2 or less, when measured as a 2% solution in water at 25° C. Thus, the polishing composition can have a viscosity bounded by any two of the aforementioned endpoints. For example, the polishing composition can have a viscosity of about 2 cps to about 5 cps, e.g., about 2 cps to about 4.2 cps, about 2 cps to about 3.1 cps, about 2.5 cps to about 3.1 cps, about 3.5 cps to about 4.2 cps, or about 3.5 cps to about 4.7 cps. Preferably, the polishing composition has a viscosity of about 2 cps to about 3.1 cps.

Without wishing to be bound by theory, it is believed that a water-soluble polymer (e.g., a PEG homopolymer, or a PEG block copolymer) can aggregate wet-process silica, which encapsulates alpha alumina. More specifically, it is believed that the use of a water-soluble polymer comprising a PEG homopolymer or a PEG block copolymer, in a polishing composition including an abrasive comprising wet-process silica and alpha alumina, can effectively form soft aggregates of silica-encapsulated alumina (referred to herein as "PEG-aggregated silica"). The PEG-aggregated silica of the polishing composition can have any suitable particle size. The particle size of the PEG-aggregated silica can be measured by any suitable method known to one of ordinary skill in the art, including, for example using a Horiba laser scattering particle size distribution analyzer. Typically, the polishing composition has a PEG-aggregated silica particle size of about 1000 nm to about 7000 nm, e.g., about 1000 nm to about 6000 nm, about 1000 nm to about 5000 nm, about 1000 nm to about 4500 nm, about 1500 to about 4000 nm, or about 2000 nm to about 4000 nm. Preferably, the polishing composition has a PEG-aggregated silica particle size of about 1000 nm to about 4000 nm.

The polishing composition can be prepared by any suitable technique, many of which are known to those skilled in the art. The polishing composition can be prepared in a batch or continuous process. Generally, the polishing composition can be prepared by combining the components herein in any order. The term "component" as used herein includes individual ingredients (e.g., abrasive, water-soluble polymer, oxidizing agent, chelating agent, pH-adjusting agent, etc.) as well as any combination of ingredients (e.g., abrasive, water-soluble polymer; oxidizing agent; chelating agent; pH-adjusting agent, etc.).

For example, the water-soluble polymer, oxidizing agent, and/or chelating agent can be added to water at the desired concentration(s). The pH can then be adjusted (as necessary) to be in the range of about 1 to about 7, or to be in the range of about 1.5 to about 3, and the abrasive can be added to the mixture at the desired concentration to form the polishing composition. The polishing composition can be prepared prior to use, with one or more components added to the polishing composition just before use (e.g., within about 1 minute before use, or within about 1 hour before use, or within about 7 days before use). The polishing composition also can be prepared by mixing the components at the surface of the substrate during the polishing operation.

The polishing composition also can be provided as a concentrate which is intended to be diluted with an appropriate amount of the aqueous carrier, particularly water, prior to use. In such an embodiment, the polishing composition concentrate can comprise a abrasive, a water-soluble polymer, an oxidizing agent, a chelating agent, a pH-adjusting agent, and water, in amounts such that, upon dilution of the concentrate with an appropriate amount of water, each component of the polishing composition will be present in the polishing composition in an amount within the appropriate range recited above for each component. Furthermore, as will be understood by those of ordinary skill in the art, the concentrate can contain an appropriate fraction of the water present in the final polishing composition in order to ensure that other components are at least partially or fully dissolved in the concentrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the situation where more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing composition are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention also provides a method of polishing a substrate with the polishing compositions described herein. The method of polishing a substrate comprises (i) providing a substrate; (ii) providing a polishing pad; (iii) providing the aforementioned chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

In particular, the invention further provides a method of chemically-mechanically polishing a substrate comprising (i) providing a substrate; (ii) providing a polishing pad; (iii) providing a chemical-mechanical polishing composition comprising, consisting essentially of, or consisting of (a) an abrasive comprising wet-process silica particles, (b) a water-soluble polymer, (c) an oxidizing agent, (d) a chelating agent, (e) a pH-adjusting agent, and (I) an aqueous carrier, wherein the pH of the polishing composition is about 1 to about 7; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

The polishing compositions of the invention are useful for polishing any suitable substrate. For example, the polishing composition can be used to polish a substrate comprising a silicon oxide layer. Suitable substrates include, but are not limited to, flat panel displays, integrated circuits, memory or rigid disks, metals, semiconductors, inter-layer dielectric (ILD) devices, microelectromechanical systems (MEMS), ferroelectrics, and magnetic heads. The substrate can further comprise at least one other layer, e.g., an insulating layer. The insulating layer can be a metal oxide, porous metal oxide, glass, organic polymer, fluorinated organic polymer, or any other suitable high or low-K insulating layer. The insulating layer can comprise, consist essentially of, or consist of silicon oxide, silicon nitride, or combinations thereof. The silicon oxide layer can comprise, consist essentially of, or consist of any suitable silicon oxide, many of which are known in the art. For example, the silicon oxide layer can comprise tetraethoxysilane (TEOS), high density plasma (HDP) oxide, borophosphosilicate glass (BPSG), high aspect ratio process (HARP) oxide, spin on dielectric (SOD) oxide, chemical vapor deposition (CVD) oxide, plasma-enhanced tetraethyl ortho silicate (PETEOS), thermal oxide, or undoped silicate glass. The substrate can further comprise a metal layer. The metal can comprise, consist essentially of, or consist of any suitable metal, many of which are known in the art, such as, for example, copper, tantalum, tungsten, titanium, platinum, ruthenium, iridium, aluminum, nickel, or combinations thereof.

The polishing composition is particularly useful in the polishing of a substrate comprising, consisting essentially of, or consisting of at least one layer of nickel-phosphorus. Particularly suitable substrates include, but are not limited to, memory or rigid disks, such as aluminum disks coated with nickel-phosphorus. For example, the polishing composition of the invention is suitable for polishing a substrate, wherein the substrate comprises a nickel phosphorus layer, and wherein the substrate is a nickel-phosphorus coated aluminum memory disk.

In accordance with the invention, a substrate can be planarized or polished with the polishing composition described herein by any suitable technique. The polishing method of the invention is particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with a polishing composition of the invention and typically a polishing pad and then abrading at least a portion of the surface of the substrate, e.g., the nickel phosphorus, or one or more of the substrate materials described herein, with the polishing composition and typically the polishing pad to polish the substrate. Any suitable polishing conditions can be used to polish a substrate according to the invention.

A substrate can be planarized or polished with the chemical-mechanical polishing composition in conjunction with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, conformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos.

5,196,353, 5,433,651, 5,609,511, 5,643,046, 5,658,183, 5,730,642, 5,838,447, 5,872,633, 5,893,796, 5,949,927, and U.S. 5,964,643. Desirably, the inspection or monitoring of the progress of the polishing process with respect to a workpiece being polished enables the determination of the polishing end-point, i.e., the determination of when to terminate the polishing process with respect to a particular workpiece.

EXAMPLES

The following examples further illustrate the invention but, of course, should not be construed as in any way limiting its scope.

Unless indicated otherwise, the polishing experiments reflected in the examples involved the use of a commercially available polishing apparatus (i.e., a DSM16B-5L/P-V™ Double Surface Polisher supplied by SpeedFam Co., Ltd., Kanagawa, Japan) with 13.88 kPa (2 psi) downforce pressure of the substrate against a Filwel CX320™ grooved polishing pad, 30 rpm platen speed, and 500 mL/min polishing composition flow. Thirty disks were polished in each run.

The removal rate (RR) of nickel-phosphorus was determined from weight measurements on five disks from each experimental run.

The viscosity of the polishing compositions of the examples was determined using a Brookfield Viscometer for a 2% solution in water at 25° C. with the shaft rotating at 30 rpm for 2 minutes.

Microwaviness (μWa-short) and edge toll-off (XRCE) measurements of the surface of the substrate were measured using a Zygo NEWVIEW™ 100 interferometer at wavelengths of 80-500 μm. The tops and bottoms of three disks from each experimental run were measured at 120°, 240°, and 360° of the disk, respectively.

Example 1

This example demonstrates the effectiveness of a polishing composition comprising a polyethylene glycol (PEG) block copolymer on the removal rate (RR), microwaviness (μWa-short), and edge roll-off (XRCE) for nickel phosphorus.

Nickel phosphorus (Ni—P) substrates were polished with eleven polishing compositions (i.e., Polishing Compositions 1A-1K). Each of Polishing Compositions 1A-1K contained 2.63 wt. % colloidal silica (i.e., wet-process silica), 0.7 wt. % alpha alumina (0.35 μm), 0.18 wt. % fumed alumina, 1.2 wt. % hydrogen peroxide, 0.8 wt. % tartaric acid (i.e., a chelating agent), and water, and was pH-adjusted with nitric acid to a pH of 2.3. Each polishing composition also contained a water-soluble polymer of the type (and having the hydrophilic-lipophilic balance (HLB) and molecular weight (MW)) and in the amount listed in Table 1.

The substrates were polished with Polishing Compositions 1A-1K under the same polishing conditions, with Polishing Composition 1A having been tested twice. Following polishing, the removal rate (RR) of nickel-phosphorus was determined for each substrate. In addition, the resulting nickel-phosphorus substrates were evaluated for microwaviness (μWa-short) and edge roll-off (XRCE). The results are set forth in Table 1.

TABLE 1

Nickel-Phosphorus Removal Rate (RR), μWa-Short, and XRCE as a Function of Type and Amount of PEG Block Copolymer

| Polishing Composition | Water-Soluble Polymer | | | | μWa-short (Å) | XRCE (nm) |
|---|---|---|---|---|---|---|
| | Type | HLB | MW (g/mol) | Conc. (wt. %) | RR (mg/min) | | |

| Polishing Composition | Type | HLB | MW (g/mol) | Conc. (wt. %) | RR (mg/min) | μWa-short (Å) | XRCE (nm) |
|---|---|---|---|---|---|---|---|
| 1A (comparative) | Silicone-based EO/PO | 9 | — | 0.01 | 25.03 | 1.80 | 56.35 |
| 1B (inventive) | TERGITOL ™ L62 | 7 | 2500 | 0.01 | 28.21 | 1.86 | 49.60 |
| 1C (inventive) | TERGITOL ™ L62 | 7 | 2500 | 0.05 | 25.21 | 1.86 | 41.87 |
| 1D (inventive) | PEG-PPG-PEG | 12-18 | ~2900 | 0.01 | 23.98 | 1.79 | 46.91 |
| 1E (inventive) | PEG-PPG-PEG | 12-18 | ~2900 | 0.05 | 17.78 | 1.83 | 44.36 |
| 1F (inventive) | PPG-PEG-PPG | 7-12 | ~2700 | 0.01 | 24.48 | 1.70 | 51.38 |
| 1G (inventive) | PPG-PEG-PPG | 7-12 | ~2700 | 0.05 | 24.11 | 1.83 | 47.38 |
| 1H (inventive) | PLURAFAC ™ LF132 | >10 | — | 0.01 | 25.13 | 1.65 | 55.48 |
| 1I (inventive) | PLURAFAC ™ LF132 | >10 | — | 0.05 | 24.02 | 1.67 | 47.64 |
| 1J (inventive) | PLURAFAC ™ LF711 | 4.2 | — | 0.01 | 23.44 | 1.56 | 57.42 |
| 1K (inventive) | PLURAFAC ™ LF711 | 4.2 | — | 0.05 | 19.98 | 1.62 | 50.53 |
| 1A (comparative) | Silicone-based EO/PO | 9 | — | 0.01 | 27.54 | 1.76 | 57.98 |

The PEG-PPG-PEG block copolymer was Sigma-Aldrich product number 435449, which is also available from BASF Corporation as PLURONIC™ L64. The PPG-PEG-PPG block copolymer was Sigma-Aldrich product number 435481, which is also available BASF Corporation as PLURONIC™ 17 R4.

These results demonstrate that a polishing composition comprising an abrasive comprising wet-process silica particles, alpha alumina particles, and fumed alumina particles; a water-soluble polymer (i.e., a PEG block copolymer); an oxidizing agent; a chelating agent; and a pH-adjusting agent, and having a pH of about 1 to about 7 (i.e., a pH of 2.3), is particularly effective for polishing substrates comprising a nickel-phosphorus layer. In particular, each of Polishing Compositions 1B-1K exhibited desirable removal rates, microwaviness, and edge roll-off.

These results further demonstrate that edge-roll off is improved by the use of water-soluble polymers having lower concentrations of propylene oxide (PO). More specifically, these results demonstrate that edge roll-off is improved by the use of water-soluble polymers having higher concentrations of ethylene oxide (EO) and, as a result, having increased hydrophilicity (i.e., higher HLB). In particular, Polishing Composition 1H, which contained 0.01 wt. % PLURAFAC™ LF132 from BASF Corporation (i.e., one PO group, HLB>10), exhibited an edge roll-off of 55.48 nm, while Polishing Composition 1J, which contained 0.01 wt. % PLURAFAC™ LF711 from BASF Corporation (i.e., seven PO groups, HLB 4.2), exhibited an edge roll-off of 57.42 nm. A similar comparison can be made with Polishing Compositions 1I and 1K, which exhibited edge roll-offs of 47.64 nm and 50.53 nm, respectively.

In addition, Polishing Composition 1D, which contained 0.01 wt. % PEG-PPG-PEG (HLB 12-18), exhibited an edge roll-off of 46.91 nm, while Polishing Composition 1F, which contained 0.01 wt. % PPG-PEG-PPG (HLB 7-12), exhibited an edge roll-off of 51.38 nm (similarly, compare Polishing Compositions 1E and 1G, which exhibited edge roll-offs of 44.36 nm and 47.38 nm, respectively). Notably, the water-soluble polymer used in Polishing Compositions 1D and 1E has a similar molecular weight to that of the water-soluble polymer used in Polishing Compositions 1F and 1G (~2900 g/mol versus ~2700 g/mol, respectively). Thus, these results demonstrate that optimum improvements in edge roll-off result from water-soluble polymers having a higher concentration of PEG (i.e., having a higher HLB), as compared to the concentration of PPG.

These results also demonstrate that microwaviness increases with increasing concentrations of water-soluble polymer. Compare, for example, Polishing Compositions 1D and 1E, which contained 0.01 wt. % and 0.05 wt. % water-soluble polymer, respectively. As the concentration of water-soluble polymer increased, microwaviness increased from 1.79 Å to 1.83 Å, respectively. A similar comparison can be made with Polishing Compositions 1F and 1G.

Example 2

This example demonstrates the effectiveness of a polishing composition comprising a polyethylene glycol homopolymer on the removal rate (RR), microwaviness (µWa-short), and edge roll-off (XRCE) for nickel phosphorus.

Nickel phosphorus (Ni—P) substrates were polished with twelve polishing compositions (i.e., Polishing Compositions 2A-2L). Each of Polishing Compositions 2A-2L contained 2.63 wt. % colloidal silica (i.e., wet-process silica), 0.7 wt. % alpha alumina (0.35 µm), 0.18 wt. % fumed alumina, 1.2 wt. % hydrogen peroxide, 0.8 wt. % tartaric acid (i.e., a chelating agent), and water, and was pH-adjusted with nitric acid to a pH of 2.3. Each polishing composition also contained a water-soluble polymer of the type (and molecular weight (MW)) and in the amount listed in Table 2.

The substrates were polished with Polishing Compositions 2A-2L under the same polishing conditions, with Polishing Composition 2A having been tested twice. Following polishing, the removal rate (RR) of nickel-phosphorus was determined for each substrate. In addition, the resulting nickel-phosphorus substrates were evaluated for microwaviness (µWa-short) and edge roll-off (XRCE). The results are set forth in Table 2.

TABLE 2

Nickel-Phosphorus Removal Rate (RR), µWa-Short, and XRCE as a Function of Type and Amount of Polyethylene Glycol Homopolymer

| Polishing Composition | Water-Soluble Polymer | | | Viscosity (cps) | RR (mg/min) | µWa-short (Å) | XRCE (nm) |
|---|---|---|---|---|---|---|---|
| | Type | MW (g/mol) | Conc. (wt. %) | | | | |
| 2A (comparative) | Silicone-based EO/PO | — | 0.01 | 1.98 | 30.78 | 2.04 | 57.53 |
| 2B (inventive) | PEG | 300 | 0.01 | 2.02 | 28.01 | 1.91 | 53.08 |
| 2C (inventive) | PEG | 300 | 0.1 | 2.24 | 30.70 | 1.95 | 51.93 |
| 2D (inventive) | PEG | 300 | 1 | 2.56 | 28.85 | 1.97 | 48.17 |
| 2E (inventive) | PEG | 600 | 0.01 | 2.39 | 31.85 | 1.95 | 51.68 |
| 2F (inventive) | PEG | 600 | 0.1 | 2.79 | 32.17 | 1.98 | 48.06 |
| 2G (inventive) | PEG | 600 | 1 | 3.14 | 29.97 | 2.02 | 45.13 |
| 2H (inventive) | PEG | 1000 | 0.01 | 3.13 | 32.61 | 1.97 | 50.27 |
| 2I (inventive) | PEG | 1000 | 0.1 | 3.70 | 29.61 | 2.01 | 44.70 |
| 2J (inventive) | PEG | 1000 | 1 | 4.11 | 28.92 | 2.06 | 36.54 |
| 2K (inventive) | PEG | 3200 | 0.01 | 3.73 | 30.98 | 2.08 | 50.24 |
| 2L (inventive) | PEG | 3200 | 0.1 | 4.66 | 26.25 | 3.36 | 26.04 |
| 2A (comparative) | Silicone-based EO/PO | — | 0.01 | 2.00 | 28.22 | 2.02 | 55.48 |

These results demonstrate that a polishing composition comprising an abrasive comprising wet-process silica particles, alpha alumina particles, and fumed alumina particles; a water-soluble polymer (i.e., a polyethylene glycol homopolymer); an oxidizing agent; a chelating agent; and a pH-adjusting agent, and having a pH of about 1 to about 7 (i.e., a pH of 2.3), is particularly effective for polishing substrates comprising a nickel-phosphorus layer. In particular, each of Polishing Compositions 2B-2L exhibited desirable removal rates, microwaviness, and edge roll-off.

Figure 2:
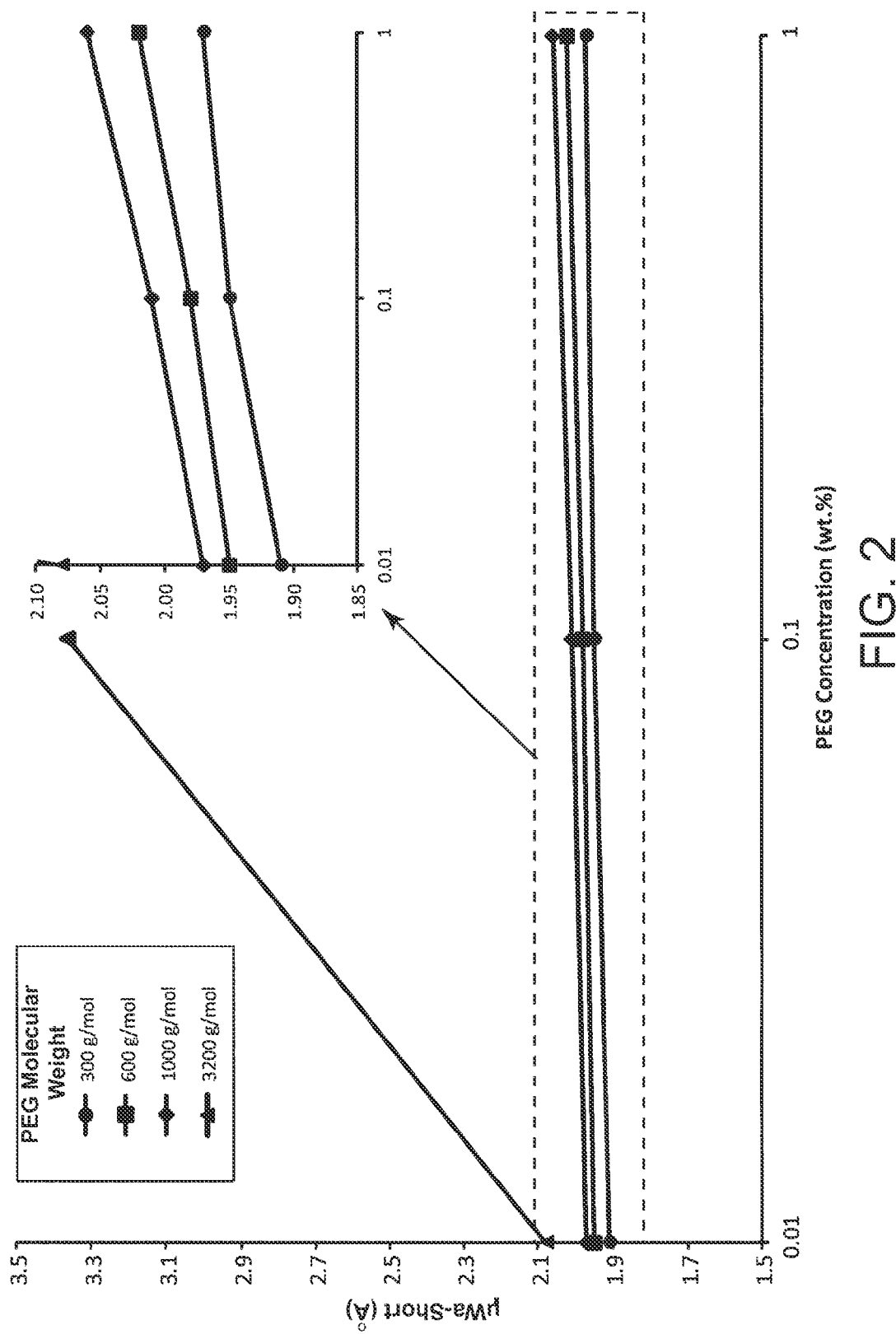
FIG. 2 is a graph of microwaviness (µWa-short) (Å) versus PEG concentration (wt. %) (in logarithmic scale) for polishing compositions comprising polyethylene glycol homopolymers of varying molecular weights.

These results further demonstrate the effect of the molecular weight and concentration of PEG homopolymer on polishing performance. FIG. 1 provides a graphical illustration of the relationship between the concentration of the PEG homopolymer (in logarithmic scale), the molecular weight of the PEG homopolymer, and the resulting XRCE of the polishing composition. Similarly. FIG. 2 provides a graphical illustration of the relationship between the concentration of the PEG homopolymer (in logarithmic scale), the molecular weight of the PEG homopolymer, and the resulting μWa-short of the polishing composition. FIGS. 1 and 2 demonstrate that edge roll-off and microwaviness decrease and increase, respectively, as the molecular weight and concentration of PEG homopolymer increase. Compare, for example, Polishing Compositions 2B, 2C, and 2D, which contained progressively higher concentrations of PEG homopolymer (300 g/mol). As the concentration of PEG homopolymer increased, the microwaviness also increased, from 1.91 Å, to 1.95 Å, and to 1.97 Å, respectively. In contrast, edge roll-off decreased from 53.08 nm, to 51.93 nm, and to 48.17 nm, respectively, as the concentration of PEG homopolymer (300 g/mol) increased.

Similarly, compare Polishing Compositions 2C, 2F, 2I, and 2L, which contained 0.1 wt. % of PEG homopolymers having progressively higher molecular weights, i.e., 300 g/mol, 600 g/mol, 1000 g/mol, and 3200 g/mol, respectively. Microwaviness increased from 1.95 Å, to 1.98 Å, to 2.01 Å, and to 3.36 Å, respectively, as the molecular weight of the PEG homopolymer increased. In contrast, edge roll-off decreased from 51.93 nm, to 48.06 nm, to 44.70 nm, and to 26.04 nm, respectively, as the molecular weight of the PEG homopolymer increased.

As illustrated by the above data and figures, the use of a higher concentration of PEG homopolymer having a relatively low molecular weight (e.g., having a molecular weight of about 1000 g/mol or less) can provide a polishing composition with desirable edge roll-off and microwaviness. In addition, the use of a lower concentration of a PEG homopolymer having a relatively high molecular weight (e.g., having a molecular weight of about 2000 g/mol or more) can provide a polishing composition with similarly desirable edge roll-off and microwaviness. For example, compare Polishing Composition 2C and Polishing Composition 2E, which contained 0.1 wt. % PEG (300 g/mol) and 0.01 wt. % PEG (600 g/mol), respectively. Polishing Compositions 2C and 2E each had a microwaviness of 1.95 Å, and had edge roll-offs of 51.93 nm and 51.68 nm, respectively. A similar comparison can be made with Polishing Composition 2F and Polishing Composition 2H.

Thus, the results of this example demonstrate that the present invention desirably allows for the control of certain properties of a polishing composition (e.g., microwaviness, edge roll-oft) by varying the concentration and/or the molecular weight of a water soluble-polymer, such as a PEG homopolymer. The use of a PEG homopolymer according to the invention can desirably improve XRCE, and the selection of an ideal molecular weight for the PEG homopolymer (e.g., 1000 g/mol or less) can simultaneously improve μWa-short.

Example 3

This example demonstrates the effectiveness of a polishing composition comprising a polyethylene glycol homopolymer on the removal rate (RR), microwaviness (μWa-short), and edge roll-off (XRCE) for nickel phosphorus.

Nickel phosphorus (Ni—P) substrates were polished with twelve polishing compositions (i.e., Polishing Compositions 3A-3G). Each of Polishing Compositions 3A-3G contained 2.63 wt. % colloidal silica (i.e., wet-process silica), 0.7 wt. % alpha alumina (0.28 μm), 0.18 wt. % fumed alumina, 1.2 wt. % hydrogen peroxide, 0.8 wt. % tartaric acid (i.e., a chelating agent), and water, and was pH-adjusted with nitric acid to a pH of 2.3. Each polishing composition also contained a water-soluble polymer of the type (and molecular weight (MW)) and in the amount listed in Table 3.

The substrates were polished with Polishing Compositions 3A-3G under the same polishing conditions, with Polishing Composition 3A having been tested twice. Following polishing, the removal rate (RR) of nickel-phosphorus was determined for each substrate. In addition, the resulting nickel-phosphorus substrates were evaluated for microwaviness (μWa-short) and edge roll-off (XRCE). The results are set forth in Table 3.

TABLE 3

Nickel-Phosphorus Removal Rates, μWa-Short, and XRCE as a Function of Type and Amount of Polyethylene Glycol Homopolymer

| Polishing Composition | Water-Soluble Polymer | | | Viscosity (cps) | RR (mg/min) | μWa-short (Å) | XRCE (nm) |
|---|---|---|---|---|---|---|---|
| | Type | MW (g/mol) | Conc. (wt. %) | | | | |
| 3A (comparative) | Silicone-based EO/PO | — | 0.01 | 1.95 | 27.46 | 1.65 | 62.77 |
| 3B (inventive) | PEG | 300 | 0.05 | 2.10 | 25.07 | 1.44 | 56.95 |
| 3C (inventive) | PEG | 300 | 0.1 | 2.19 | 25.33 | 1.55 | 56.34 |
| 3D (inventive) | PEG | 600 | 0.1 | 2.55 | 25.61 | 1.63 | 49.50 |
| 3E (inventive) | PEG | 1000 | 0.05 | 2.64 | 25.91 | 1.63 | 45.85 |
| 3F (inventive) | PEG | 1000 | 0.1 | 3.02 | 24.14 | 1.67 | 37.50 |

TABLE 3-continued

Nickel-Phosphorus Removal Rates, μWa-Short, and XRCE as a
Function of Type and Amount of Polyethylene Glycol Homopolymer

| Polishing Composition | Water-Soluble Polymer | | | Viscosity (cps) | RR (mg/min) | μWa-short (Å) | XRCE (nm) |
| --- | --- | --- | --- | --- | --- | --- | --- |
| | Type | MW (g/mol) | Conc. (wt. %) | | | | |
| 3G (inventive) | PEG | 3200 | 0.1 | 3.68 | 23.48 | 2.60 | 26.41 |
| 3A (comparative) | Silicone-based EO/PO | — | 0.01 | 1.92 | 25.58 | 1.60 | 53.99 |

These results demonstrate that a polishing composition comprising an abrasive comprising wet-process silica particles, alpha alumina particles, and fumed alumina particles; a water-soluble polymer (i.e., a polyethylene glycol homopolymer); an oxidizing agent; a chelating agent; and a pH-adjusting agent, and having a pH of about 1 to about 7 (i.e., a pH of 2.3), is particularly effective for polishing substrates comprising a nickel-phosphorus layer. Each of Polishing Compositions 3B-3G exhibited desirable removal rates, microwaviness, and edge roll-off.

Like the results of Example 2, these results further demonstrate that edge roll-off and microwaviness decrease and increase as the molecular weight and concentration, respectively, of PEG homopolymer increase. Compare, for example. Polishing Compositions 3B and 3C, which contained 0.05 wt. % and 0.1 wt. % PEG homopolymer (300 g/mol), respectively. Polishing Composition 3C exhibited a higher microwaviness than that of Polishing Composition 3B, but Polishing Composition 3C exhibited a lower edge roll-off than that of Polishing Composition 3B. A similar comparison can be made with Polishing Compositions 3E and 3F.

In addition, a comparison can be made between Polishing Compositions 3C, 3D, 3F, and 3G, which contained 0.1 wt. % of PEG homopolymers having progressively higher molecular weights, i.e., 300 g/mol, 600 g/mol, 1000 g/mol, and 3200 g/mol respectively. Microwaviness increased from 1.55 Å, to 1.63 Å, to 1.67 Å, and to 2.60 Å, respectively, as the molecular weight of the PEG homopolymer increased. In contrast, edge roll-off decreased from 56.34 nm, to 49.50 nm, to 37.50 nm, and to 26.41 nm, respectively, as the molecular weight of the PEG homopolymer increased.

Figure 3:
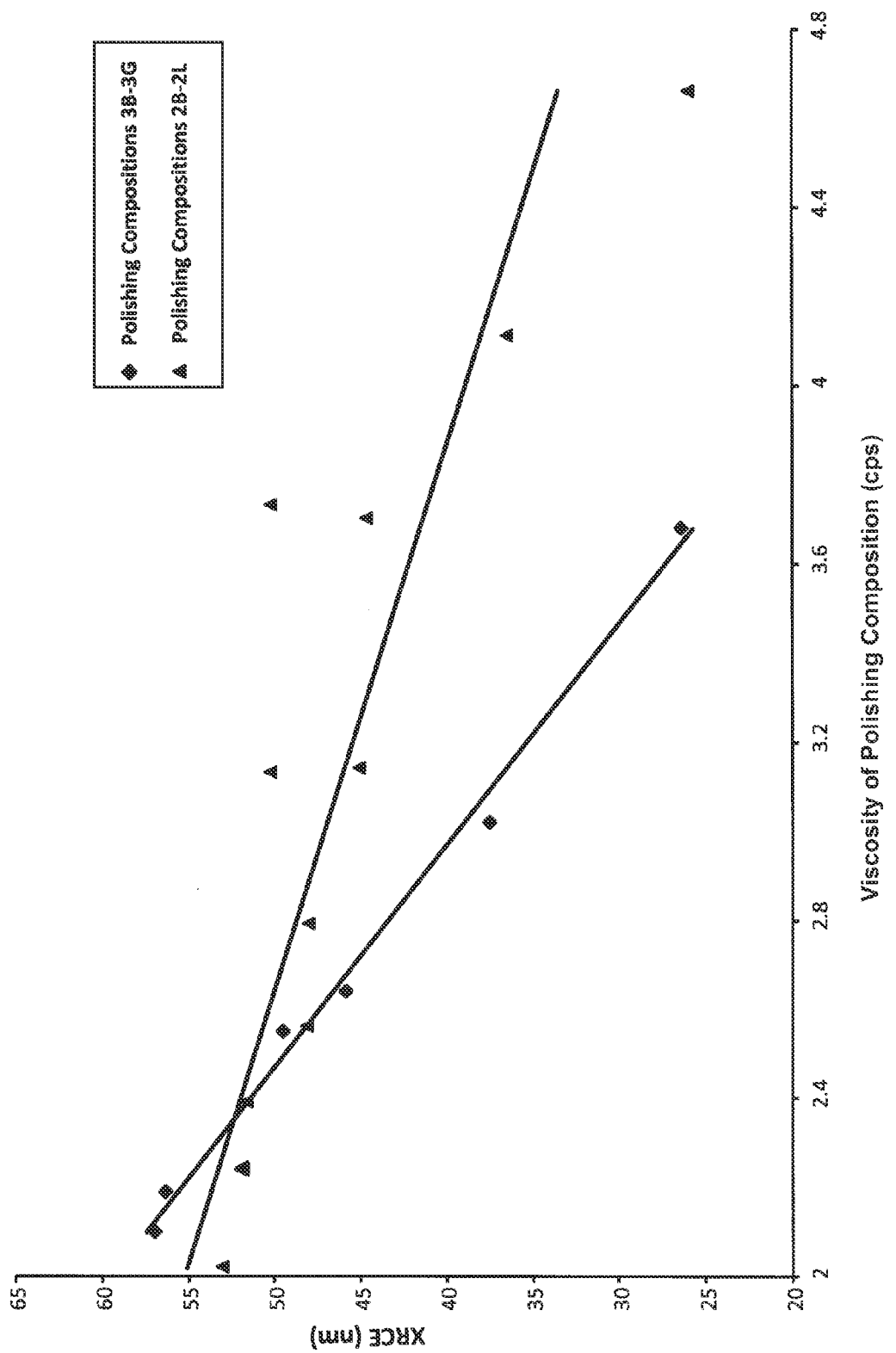
FIG. 3 is a graph of edge roll-off (XRCE) (nm) versus viscosity for polishing compositions comprising polyethylene glycol homopolymers of varying molecular weights, and alpha-alumina particles of varying average particle sizes.

The results of Examples 2 and 3 also demonstrate the relationship between the viscosity of the polishing composition and the resulting edge roll-off and microwaviness of the polishing composition. In that respect, the graph of FIG. 3 plots the relationship between the viscosity of the polishing composition and the edge roll-off (XRCE), for the polishing compositions of Example 2 (containing 0.35 μm alpha alumina) and Example 3 (containing 0.28 m alpha alumina). As shown in the graph of FIG. 3, XRCE improves (i.e., decreases) with increasing viscosity of the polishing composition.

Figure 4:
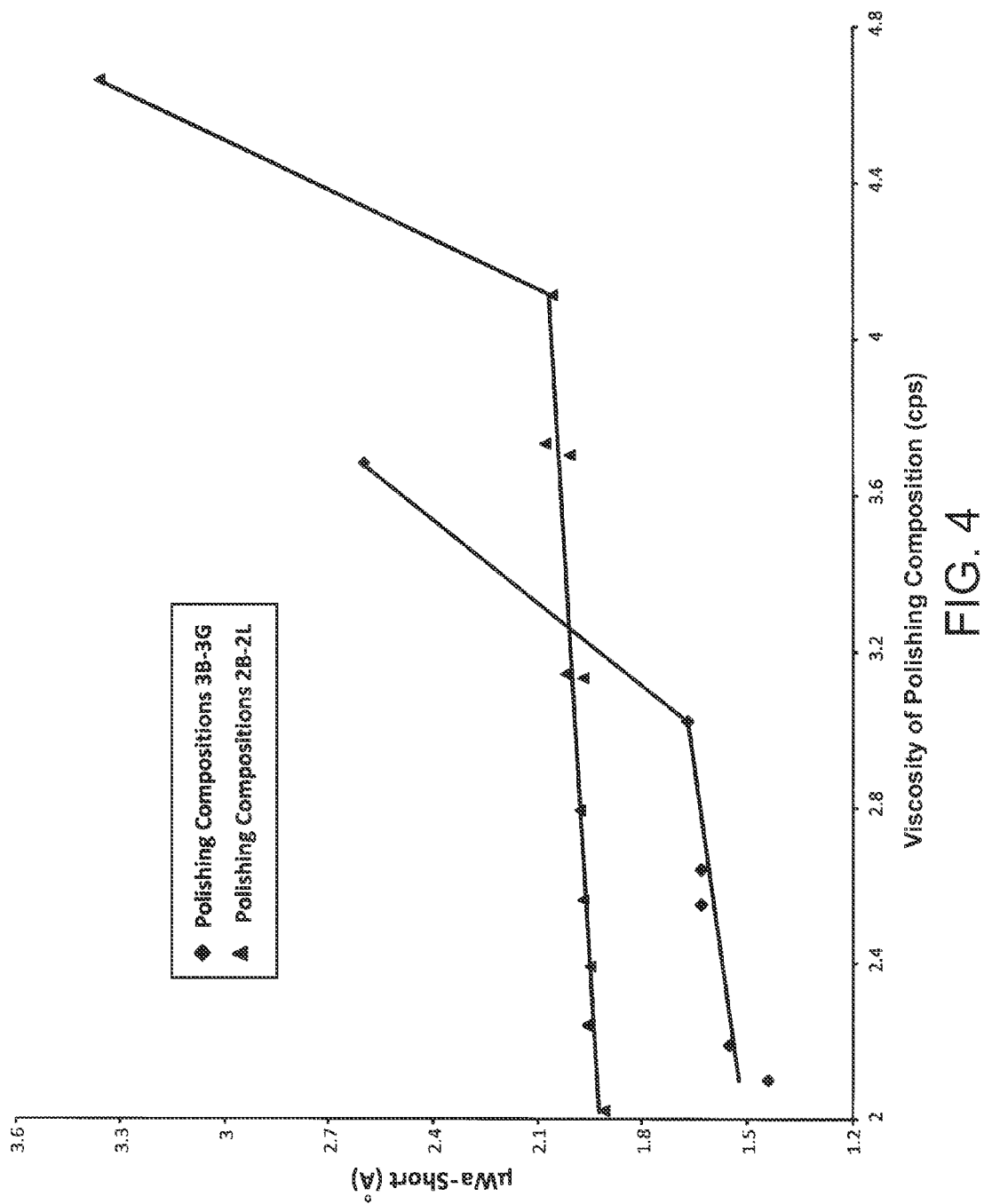
FIG. 4 is a graph of microwaviness (µWa-short) (Å) versus viscosity for polishing compositions comprising polyethylene glycol homopolymers of varying molecular weights, and alpha-alumina particles of varying average particle sizes.

The graph of FIG. 4 plots the relationship between the viscosity of the polishing composition and the microwaviness (μWa-short), for the polishing compositions of Example 2 (containing 0.35 j m alpha alumina) and Example 3 (containing 0.28 m alpha alumina). Specifically, the graph of FIG. 4 demonstrates that μWa-short is relatively constant with increasing viscosity of the polishing composition, until a certain viscosity is reached, after which point the μWa-short increases dramatically.

Thus, the invention desirably allows for the control of certain properties of a polishing composition (e.g., microwaviness and edge roll-off) by varying the viscosity of the polishing composition (e.g., by varying the concentration and/or molecular weight of the water-soluble polymer). In particular, microwaviness and edge roll-off can each be minimized by selecting a desirable viscosity for the polishing composition. As illustrated by the graph of FIG. 4, the polishing compositions of Example 2, for example, preferably have a viscosity of about 2 cps to about 4.2 cps, and more preferably about 3.5 cps to about 4.2 cps. In this viscosity range, both the microwaviness and edge roll-off are minimized. As also illustrated by the graph of FIG. 4, the polishing compositions of Example 3, for example, preferably have a viscosity of about 2 cps to about 3.1 cps, and more preferably about 2.5 cps to about 3.1 cps. In this viscosity range, both the microwaviness and edge roll-off are minimized.

These results further demonstrate that the impact of viscosity on microwaviness and edge roll-off is more pronounced for polishing compositions containing alpha alumina having a smaller particle size. For the polishing compositions of Example 3, which included 0.28 μm alpha alumina, microwaviness increased dramatically when the viscosity of the polishing composition was greater than about 3.1 cps (see FIG. 4 and Table 3; compare Polishing Compositions 3F and 3G). For the polishing compositions of Example 2, which included 0.35 μm alpha alumina, microwaviness remained relatively constant when the viscosity of the polishing composition increased to greater than about 3.1 cps, but microwaviness increased dramatically when the viscosity of the polishing composition was greater than about 4.2 cps (see FIG. 4 and Table 2; compare Polishing Compositions 2F and 2G. Polishing Compositions 2F and 2H, and Polishing Compositions 2J and 2L). Similarly, as illustrated by FIG. 3, edge roll-off decreased significantly for the polishing compositions of Example 3 as the viscosity of the polishing composition increased to greater than about 2.3 cps. The edge roll-off of the polishing compositions of Example 2, however, did not decrease as significantly when the viscosity of the polishing composition increased to greater than about 2.3 cps.

Example 4

This example demonstrates the effect of the PEG-aggregated silica particle size of a polishing composition containing a polyethylene glycol homopolymer on the microwaviness (μWa-short) and edge roll-off (XRCE) for nickel phosphorus.

The PEG-aggregated silica particle size of Polishing Compositions 2F, 2H-2J, and 2L was determined using a Horiba LA-920™ laser scattering particle size distribution analyzer. About 1 mL of a 2% silica suspension was used for each particle size test. The results are set forth in Table 4, below.

TABLE 4

PEG-Aggregated Silica Particle Size, µWa-Short, and XRCE as a Function of Type and Amount of Polyethylene Glycol Homopolymer

| Polishing Composition | Water-Soluble Polymer | | | PEG-Aggregated Silica Particle Size (nm) | µWa-short (Å) | XRCE (nm) |
| --- | --- | --- | --- | --- | --- | --- |
| | Type | Molecular Weight (g/mol) | Concentration (wt. %) | | | |
| 2F (inventive) | PEG | 600 | 0.1 | 1920 | 1.98 | 48.06 |
| 2H (inventive) | PEG | 1000 | 0.01 | 1228 | 1.97 | 50.27 |
| 2I (inventive) | PEG | 1000 | 0.1 | 2572 | 2.01 | 44.70 |
| 2J (inventive) | PEG | 1000 | 1 | 4050 | 2.06 | 36.54 |
| 2L (inventive) | PEG | 3200 | 0.1 | 6052 | 3.36 | 26.04 |

Figure 5:
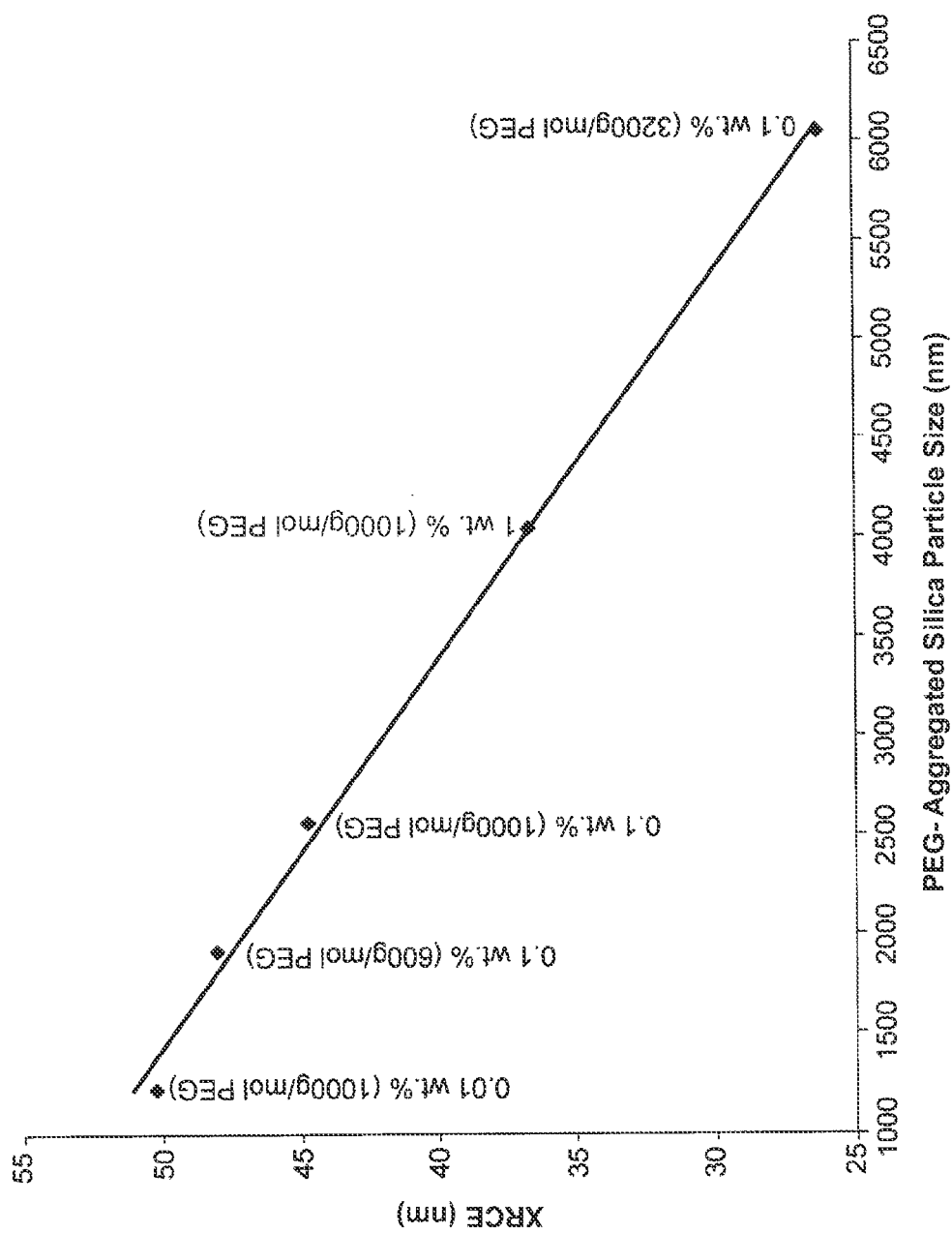
FIG. 5 is a graph of edge roll-off (XRCE) (nm) versus PEG-aggregated silica particle size (nm) for polishing compositions comprising different concentrations of polyethylene glycol homopolymers of varying molecular weights.

These results demonstrate the relationship between the PEG-aggregated silica particle size of the polishing composition and the resulting edge roll-off and microwaviness of the polishing composition. In particular, the graph of FIG. 5 plots the relationship between PEG-aggregated silica particle size of the polishing composition and the edge roll-off (XRCE). As shown in the graph of FIG. 5. XRCE is approximately linearly related to the PEG-aggregated silica particle size, and XRCE improves (i.e., decreases) with increasing PEG-aggregated silica particle size. These results demonstrate that the presence of PEG-aggregated silica improves edge roll-off. Without wishing to be bound by theory, it is believed that the presence of PEG-aggregated silica at the edge of the polishing disk, where there is lower polishing pressure and reduced contact with the carrier, reduces the probability of edge polishing, and thereby improves edge roll-off, as a result of its relatively large particle size.

Figure 6:
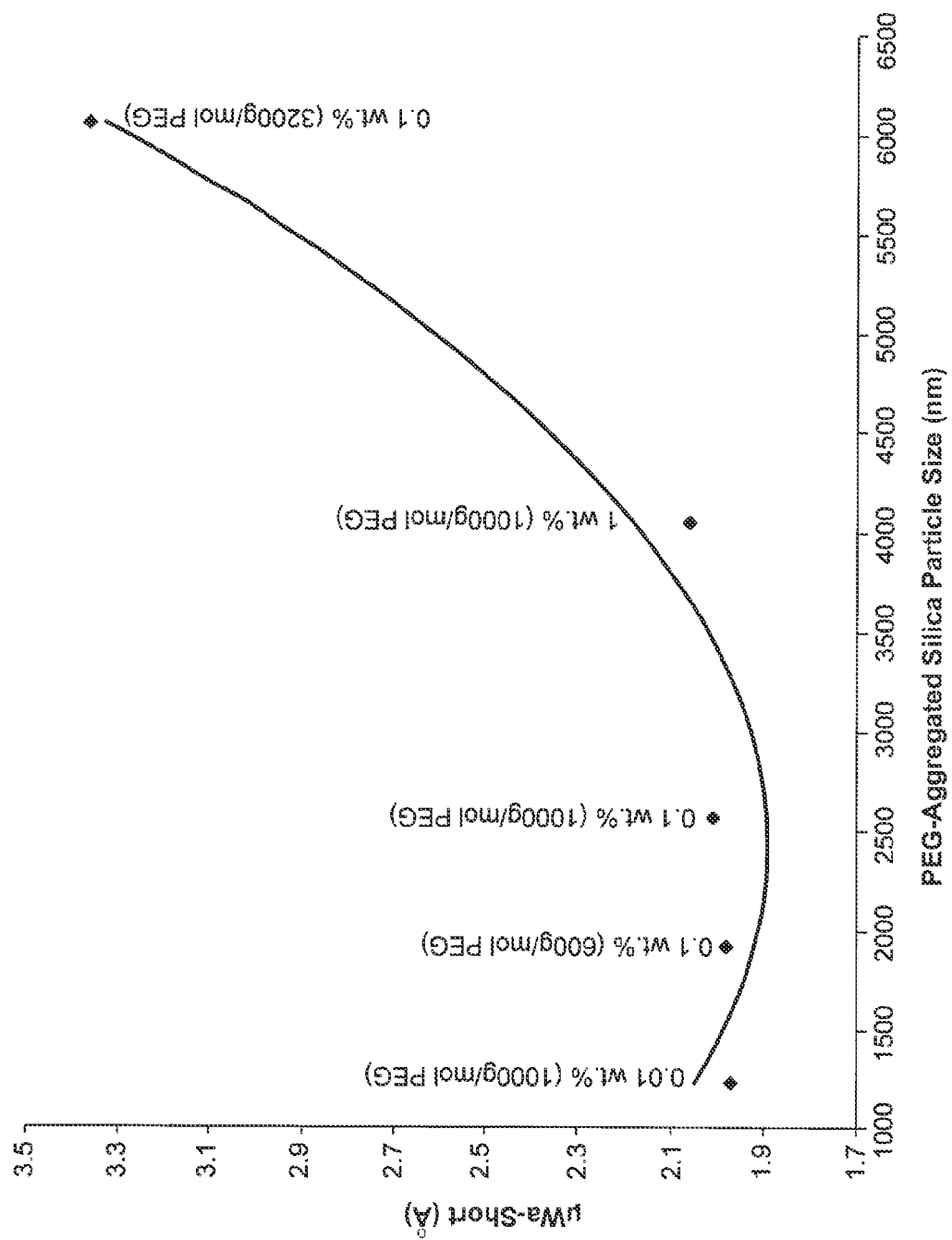
FIG. 6 is a graph of microwaviness (µWa-short) (Å) versus PEG-aggregated silica particle size (nm) for polishing compositions comprising different concentrations of polyethylene glycol homopolymers of varying molecular weights.

The graph of FIG. 6 plots the relationship between the PEG-aggregated silica particle size of the polishing composition and the microwaviness (µWa-short) of the polishing composition. Specifically, the graph of FIG. 6 demonstrates that µWa-short is relatively constant with increasing PEG-aggregated silica particle size, until a certain particle size is reached, after which point the µWa-short increases dramatically. Without wishing to be bound by theory, it is believed that high polishing pressure present at the center of the polishing disk can break or reduce the particle size of PEG-aggregated silica, which reduces microwaviness. In view of these results, for the Polishing Compositions of Example 2 in particular, the PEG-aggregated silica particle size desirably is relatively high (e.g., about 1000 nm, about 1200 nm, about 1500 nm, about 2000 nm, about 2500 nm, about 3000 nm, or about 3500 nm) in order to maximize the reduction in edge roll-off, but the PEG-aggregated silica particle size desirably is below about 400 nm, in order to maintain a desirably low microwaviness.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example "at least one of A and B") is to be construed to mean one item selected from the listed items (A or B) or any combination of two or more of the listed items (A and B), unless otherwise indicated herein or clearly contradicted by context. The terms "comprising." "having." "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) an abrasive comprising wet-process silica particles,
   (b) a water-soluble polymer selected from the group consisting of a polyethylene glycol homopolymer and a polyethylene glycol (PEG) and polypropylene glycol (PPG) block copolymer.
   (c) an oxidizing agent,
   (d) a cheating agent,
   (e) a pH-adjusting agent, and (f) an aqueous carrier,
wherein the pH of the polishing composition is about 1 to about 7;
wherein the abrasive further comprises alpha particles having an average particle size of about 100 nm to about 1000 nm;
wherein the water-soluble polymer is present in the polishing composition at a concentration of about 0.0001 wt % to about 1 wt %.

2. The chemical-mechanical polishing composition of claim 1, wherein the wet-process silica particles have an average particle size of about 1 nm to about 1000nm.

3. The chemical-mechanical polishing composition of claim 1, wherein the wet-process silica particles have an average particle size of about 4 nm to about 300nm.

4. The chemical-mechanical polishing composition of claim 1, wherein the wet-process silica particles have an average particle size of about 20 nm to about 100nm.

5. The chemical-mechanical polishing composition of claim 1, wherein the wet-process silica particles are present in the polishing composition at a concentration of about 1 wt. % to about 10 wt. %.

6. The chemical-mechanical polishing composition of claim 5, wherein the wet-process silica particles are present in the polishing composition at a concentration of about 2 wt. % to about 5 wt. %.

7. The chemical-mechanical polishing composition of claim 1, wherein the alpha alumina particles have an average particle size of about 100 nm to about 500 nm.

8. The chemical-mechanical polishing composition of claim 1, wherein the alpha alumina particles have an average particle size of about 200 nm to about 400 nm.

9. The chemical-mechanical polishing composition of claim 1, wherein the alpha alumina particles are present in the polishing composition at a concentration of about 0.3 wt. % to about 2 wt. %.

10. The chemical-mechanical polishing composition of claim 9, wherein the alpha alumina particles are present in the polishing composition at a concentration of about 0.5wt. % to about 1 wt. %.

11. The chemical-mechanical polishing composition of claim 1, wherein the abrasive further comprises fumed alumina particles.

12. The chemical-mechanical polishing composition of claim 11, wherein the fumed alumina particles are present in the polishing composition at a concentration of about 0.005wt. % to about 1 wt. %.

13. The chemical-mechanical polishing composition of claim 11, wherein the fumed alumina particles are present in the polishing composition at a concentration of about 0.05 wt. % to about 0.25 wt. %.

14. The chemical-mechanical polishing composition of claim 1, wherein the water-soluble polymer is a polyethylene glycol (PEG) and polypropylene glycol (PPG) block copolymer.

15. The chemical-mechanical polishing composition of claim 1, wherein the water-soluble polymer is a polyethylene glycol homopolymer.

16. The chemical-mechanical polishing composition of claim 15, wherein the polyethylene glycol homopolymer has a molecular weight of about 300 g/mol to about 50,000 g/mol.

17. The chemical-mechanical polishing composition of claim 15, wherein the polyethylene glycol homopolymer has a molecular weight of about 300 g/mol to about 3500 g/mol.

18. The chemical-mechanical polishing composition of claim 15, wherein the polyethylene glycol homopolymer has a molecular weight of about 1000 g/mol.

19. The chemical-mechanical polishing composition of claim 15, wherein the polyethylene glycol homopolymer has a molecular weight of about 2000 g/mol.

20. The chemical-mechanical polishing composition of claim 1, wherein the water-soluble polymer is present in the polishing composition at a concentration of about 0.01 wt. % to about 0.5 wt. %.

21. The chemical-mechanical polishing composition of claim 1, wherein the water-soluble polymer is present in the polishing composition at a concentration of about 0.1 wt. % to about 0.2 wt. %.

22. The chemical-mechanical polishing composition of claim 1, wherein the water-soluble polymer has a hydrophilic-lipophilic balance (HLB) of about 4 or more.

23. The chemical-mechanical polishing composition of claim 22, wherein the water-soluble polymer has an HLB of about 10 or more.

24. The chemical-mechanical polishing composition of claim 1, wherein the oxidizing agent comprises hydrogen peroxide.

25. The chemical-mechanical polishing composition of claim 1, wherein the oxidizing agent is present in the polishing composition at a concentration of about 0.1 wt. % to about 5wt. %.

26. The chemical-mechanical polishing composition of any 1, wherein the chelating agent comprises an amino acid or an organic carboxylic acid.

27. The chemical-mechanical polishing composition of claims 1, wherein the chelating agent is tartaric acid, glycine, or malonic acid.

28. The chemical-mechanical polishing composition of claim 1, wherein the chelating agent is present in the polishing composition at a concentration of about 0.005 wt. % to about 1 wt. %.

29. The chemical-mechanical polishing composition of claim 28, wherein the chelating agent is present in the polishing composition at a concentration of about 0.5 wt. % to about 1wt. %.

30. The chemical-mechanical polishing composition of claim 1, wherein the pH of the polishing composition is about 1.5 to about 3.

31. A method of polishing a substrate comprising:
(i) providing a substrate;
(ii) providing a polishing pad;
(iii) providing the chemical-mechanical polishing composition of claim 1;
(iv) contacting the substrate with the polishing pad and the chemical-mechanical polishing composition; and
(v) moving the polishing pad and the chemical-mechanical polishing composition relative to the substrate to abrade at least a portion of the substrate to polish the substrate.

32. A method of polishing a substrate comprising:
(i) providing a substrate, wherein the substrate comprises a nickel phosphorus layer;
(ii) providing a polishing pad;
(iii) providing the chemical-mechanical polishing composition of claim 1;
(iv) contacting the substrate with the polishing pad and the chemical-mechanical polishing composition; and
(v) moving the polishing pad and the chemical-mechanical polishing composition relative to the substrate to abrade at least a portion of the nickel phosphorus layer on a surface of the substrate to polish the substrate.

33. The method of claim 32, wherein the substrate is a nickel-phosphorus coated aluminum memory disk.

* * * * *